US010497725B2

(12) United States Patent
Saitoh et al.

(10) Patent No.: US 10,497,725 B2
(45) Date of Patent: Dec. 3, 2019

(54) METHOD OF PRODUCING DISPLAY PANEL BOARD

(71) Applicant: SHARP KABUSHIKI KAISHA, Sakai, Osaka (JP)

(72) Inventors: Takao Saitoh, Sakai (JP); Yohsuke Kanzaki, Sakai (JP); Kazuatsu Ito, Sakai (JP); Seiji Kaneko, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/078,280

(22) PCT Filed: Feb. 17, 2017

(86) PCT No.: PCT/JP2017/005941
§ 371 (c)(1),
(2) Date: Aug. 21, 2018

(87) PCT Pub. No.: WO2017/145941
PCT Pub. Date: Aug. 31, 2017

(65) Prior Publication Data
US 2019/0051678 A1 Feb. 14, 2019

(30) Foreign Application Priority Data
Feb. 26, 2016 (JP) ................. 2016-035388

(51) Int. Cl.
*H01L 27/12* (2006.01)
*G02F 1/1368* (2006.01)
(Continued)

(52) U.S. Cl.
CPC ........ *H01L 27/1288* (2013.01); *G02F 1/1368* (2013.01); *G02F 1/136286* (2013.01);
(Continued)

(58) Field of Classification Search
CPC .......... H01L 29/41733; H01L 29/4908; H01L 29/786; H01L 29/78618; H01L 27/1288; G02F 1/1368; G02F 1/136286
See application file for complete search history.

(56) References Cited

U.S. PATENT DOCUMENTS 6,038,008 A * 3/2000 Kim ................. G02F 1/136227
349/138
8,324,626 B2 * 12/2012 Kimura ............... H01L 27/1225
257/59
(Continued)

FOREIGN PATENT DOCUMENTS

JP 2011-151194 A 8/2011

*Primary Examiner* — Joseph C. Nicely
(74) *Attorney, Agent, or Firm* — ScienBiziP, P.C.

(57) ABSTRACT

A method includes a conductive film forming process of forming a conductive film 51 covering a gate insulation film IS and a semiconductor film 42, the gate insulation film 45 covering a gate electrode 37G and a gate line 35G formed on a glass substrate 32 and the semiconductor film 42 formed on the gate insulation film 45 while overlapping the gate electrode 37G, a first etching process of etching the conductive film 51 and forming a source conductive film 46S connected to the semiconductor film 42 and a drain conductive film 46D connected to the semiconductor film 42, a resist forming process performed after the first etching process and forming a resist 53R covering the semiconductor film 42, the source conductive film 46S, and the drain conductive film 46D, and a second etching process performed after the resist forming process and performing etching for removing the conductive film 51 while using the resist 53R as a mask.

7 Claims, 15 Drawing Sheets

(51) Int. Cl.
*H01L 29/786* (2006.01)
*G02F 1/1362* (2006.01)
*H01L 21/027* (2006.01)
*H01L 21/3213* (2006.01)
*H01L 29/24* (2006.01)
*H01L 29/40* (2006.01)
*H01L 29/417* (2006.01)
*H01L 29/49* (2006.01)
*H01L 29/66* (2006.01)

(52) U.S. Cl.
CPC .... *H01L 21/0273* (2013.01); *H01L 21/32139* (2013.01); *H01L 27/124* (2013.01); *H01L 27/1262* (2013.01); *H01L 29/24* (2013.01); *H01L 29/401* (2013.01); *H01L 29/41733* (2013.01); *H01L 29/4908* (2013.01); *H01L 29/66969* (2013.01); *H01L 29/78618* (2013.01); *G02F 2001/136295* (2013.01); *H01L 27/1225* (2013.01); *H01L 29/7869* (2013.01); *H01L 29/78693* (2013.01)

(56) References Cited

U.S. PATENT DOCUMENTS

| | | | |
|---|---|---|---|
| 8,427,595 B2* | 4/2013 | Yamazaki | H01L 27/1225 349/43 |
| 2005/0250270 A1* | 11/2005 | Wu | H01L 27/1288 438/197 |
| 2007/0164330 A1* | 7/2007 | Jeong | G02F 1/136286 257/291 |
| 2009/0166631 A1* | 7/2009 | Yamazaki | H01L 29/78684 257/57 |
| 2011/0176081 A1 | 7/2011 | Sonoda et al. | |
| 2014/0184990 A1 | 7/2014 | Sonoda et al. | |

* cited by examiner

METHOD OF PRODUCING DISPLAY PANEL BOARD

TECHNICAL FIELD

The present invention relates to a method of producing a display panel board.

BACKGROUND ART

An example of a known display board used in a liquid crystal display device is described in Patent Document 1. Patent Document 1 describes a display board including gate lines, a gate insulation film, a semiconductor film, and source lines (and drain lines) disposed on a transparent substrate in this sequence.

RELATED ART DOCUMENT

Patent Document

Patent Document 1: Japanese Unexamined Patent Application Publication No. 2011-151194

Problem to be Solved by the Invention

In the above configuration, the gate insulation film is included in an upper layer of the gate lines and therefore, a step portion is formed on the gate insulation film due to a thickness of the gate lines. The conductive film is likely to remain at the step portion as etching residues when the source lines and the drain lines are formed with etching and the etching residues of the conductive film may cause a short-circuit. Especially, in recent years, it has been demanded to reduce the width of the lines and lower the resistance to achieve a display device of high display resolution. Therefore, to lower the resistance, the thickness of the gate lines tends to be greater and the height of the step portion is also increased. Accordingly, the residues of the conductive film are further likely to be produced at the etching operation.

DISCLOSURE OF THE PRESENT INVENTION

An object of the present invention is to remove a residue of a conductive film.

Means for Solving the Problem

To solve the above problem, a method of producing a display panel board of the present invention includes a conductive film forming process of forming a conductive film covering a gate insulation film and a semiconductor film, the gate insulation film covering a gate electrode and a gate line formed on a substrate and the semiconductor film formed on the gate insulation film while overlapping the gate electrode, a first etching process performed after the conductive film forming process and etching the conductive film and forming a source conductive film and a drain conductive film, the source conductive film including a source electrode connected to the semiconductor film and the drain conductive film including a drain electrode connected to the semiconductor film, a resist forming process performed after the first etching process and forming a resist covering the semiconductor film, the source conductive film, and the drain conductive film, and a second etching process performed after the resist forming process and performing etching for removing the conductive film while using the resist as a mask.

A step portion is produced at a portion of the gate insulation film overlapping a peripheral edge of the gate electrode and also at a portion thereof overlapping the peripheral edge of the gate line due to thickness of the gate electrode and the gate line. If the source conductive film and the drain conductive film are formed on the gate insulation film with etching, the conductive film is less likely to be removed at the step portion of the gate insulation film and a residue of the conductive film may be produced. In the above configuration, after the source conductive film and the drain conductive film are formed in the first etching process, the resist that covers the source conductive film and the drain conductive film is formed and the etching for removing the conductive film is performed (the second etching process). Accordingly, even if the conductive film remains at the step portion of the gate insulation film, the remaining conductive film can be removed. Since the semiconductor film is covered with the resist, the semiconductor film can be protected from etching in the second etching process.

In the above configuration, in the resist forming process, the resist may be formed so as not to be disposed on at least a part of an extending portion of a step portion formed on the gate insulation film, the part of the extending portion extending from the source conductive film to the drain conductive film.

If a residue of the conductive film is produced at the extending portion extending from the source conductive film to the drain conductive film, the source electrode and the drain electrode may be electrically connected to each other via the residue of the conductive film. According to the present invention, the resist is formed except for at least a part of the extending portion. Accordingly, even if the residue connecting the source conductive film and the drain conductive film is produced at the extending portion, the residue can be removed in the second etching process and the source electrode and the drain electrode are not electrically connected to each other via the residue.

In the first etching process, the source conductive film and the drain conductive film may include source conductive films and drain conductive films, and the source conductive films and the drain conductive films may be formed and arranged in an extending direction of the gate line, and in the resist forming process, the resist may be formed so as not to be disposed at least on a part of a source in-between extending portion of a step portion formed on the gate insulation film, the part of the source in-between extending portion extending from one to another of two adjacent source conductive films.

The residue of the conductive film that is produced between the two adjacent source conductive films can be removed in the second etching process, and the two adjacent source conductive films are less likely to be electrically connected to each other via the residue of the conductive film.

In the first etching process, the source conductive film and the drain conductive film may include source conductive films and drain conductive films, and the source conductive films and the drain conductive films may be formed and arranged in an extending direction of the gate line, out of two of the source conductive films having the drain conductive film therebetween, one source conductive film disposed on an opposite side from another source conductive film connected to the drain conductive film via the semiconductor film may be an opposite side source conductive film, and in the resist forming process, the resist may be formed so as not to be disposed at least on a part of an opposite-side extending portion of a step portion formed on the gate insulation film, the part of the opposite-side extending portion extending from the drain conductive film to the opposite-side source conductive film.

Even if the residue connecting the drain conductive film and the source conductive film is produced, the residue is removed in the second etching process, and the drain conductive film and the source conductive film are less likely to be electrically connected to each other via the residue of the conductive film.

In the resist forming process, the resist may be formed in a shape following a shape of the source conductive film and the drain conductive film. Accordingly, for the source conductive film and the drain conductive film, substantially same portions as those removed in the first etching process can be removed in the second etching process. Therefore, etching time in the first etching process is shortened and the semiconductor film is less likely to be adversely affected by the etching.

In the resist forming process, the resist may be formed to cover the gate insulation film. The gate insulation film that is covered with the resist is less likely to be removed in the second etching process.

The gate electrode and the gate line may include aluminum. The gate electrode and the gate line containing aluminum reduce cost compared to a configuration containing copper. However, aluminum is greater in electric resistance than copper. Therefore, in the configuration including the gate electrode and the gate line containing aluminum, the gate electrode and the gate line are preferably made thicker than those containing copper to decrease electric resistance. As the gate electrode and the gate line are thicker, the step portion of the gate insulation film is increased in height thereof due to the increased thickness of the gate electrode and the gate line. Therefore, the residue of the conductive film is more likely to be produced. The residue of the conductive film can be removed in the second etching process and the present invention is preferable for the configuration including the gate electrode and the gate line containing aluminum.

Advantageous Effect of the Invention

According to the present invention, a residue of the conductive film can be removed.

MODES FOR CARRYING OUT THE INVENTION

First Embodiment

Figure 1:
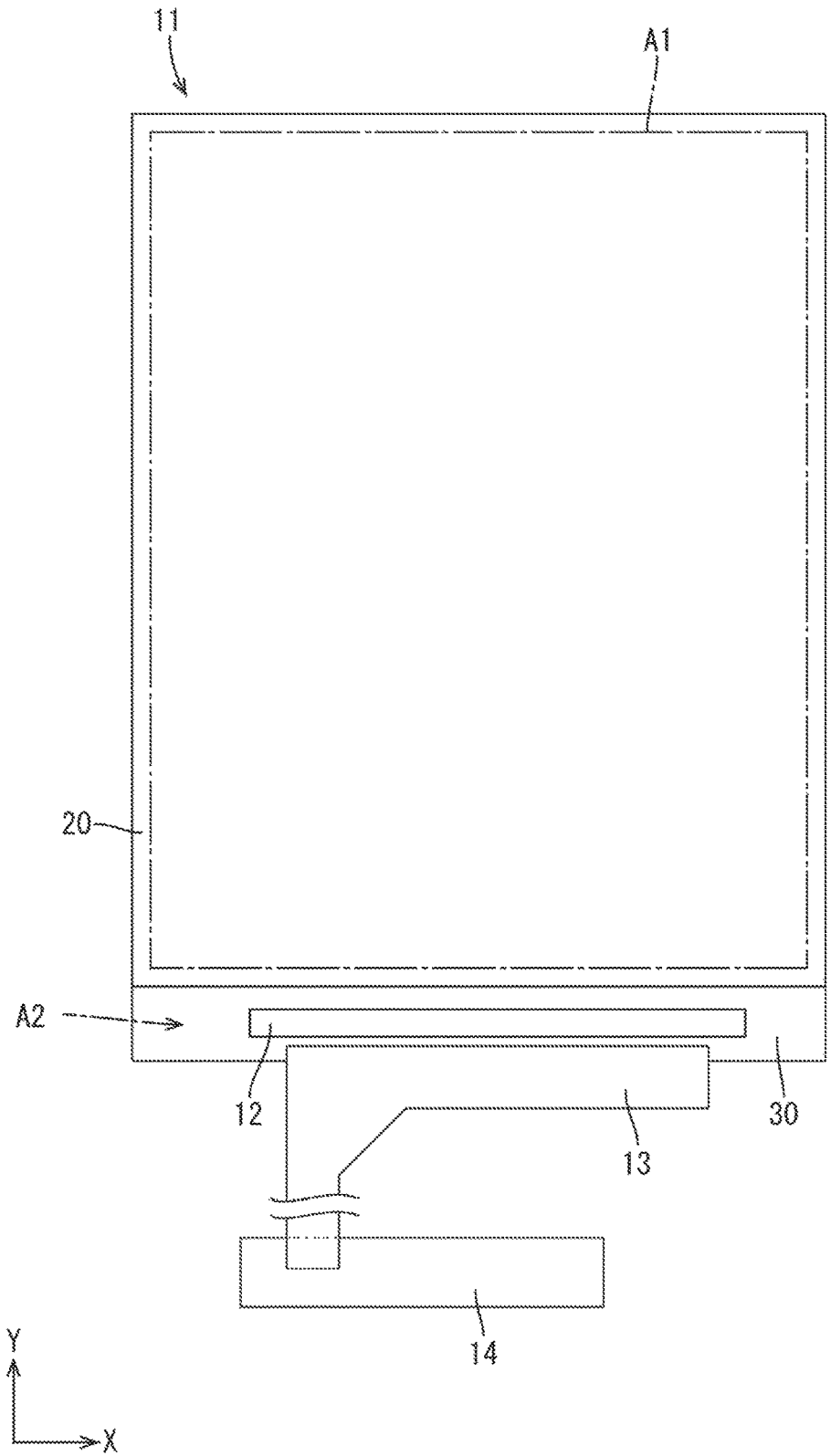
FIG. 1 is a general plan view illustrating a liquid crystal panel included in a liquid crystal display device according to a first embodiment of the present invention.

A first embodiment of the present technology will be described with reference to FIGS. 1 to 14. In this embodiment, a liquid crystal panel 11 (a display panel) included in a liquid crystal display device will be described as an example. X-axis, Y-axis and Z-axis may be present in the drawings and each of the axial directions represents a direction represented in each drawing. An upper side and a lower side in FIGS. 2, 6, and 7 correspond to a front side and a back side, respectively. The liquid crystal display device includes the liquid crystal panel 11 illustrated in FIG. 1 and a backlight unit (a lighting device, not illustrated) that is an external light source supplying light to the liquid crystal panel 11 for display. In the following description, among components of the liquid crystal display device, the liquid crystal panel 11 will be described in detail. However, other components such as the backlight unit have been known and details thereof will not be described.

As illustrated in FIG. 1, the liquid crystal panel 11 has a vertically-long square (rectangular) shape as a whole. The liquid crystal panel 11 includes a display section A1 (an active area) that is off centered toward one of ends of a short dimension thereof (the upper side in FIG. 1). A driver 12 and a flexible printed circuit board 13 for supplying various kinds of signals are arranged at the other end of the short dimension of the liquid crystal panel 11 (the lower side in FIG. 1). An area of the liquid crystal panel 11 outside the display section A1 is a non-display section A2 (non-active area) in which images are not displayed. The non-display section A2 includes a substantially frame-shaped section surrounding the display section A1 (a frame section of a CF board 20, which will be described later) and a section on the other end of the short dimension (an exposed section of an array board 30 not overlapping the CF board 20). The section on the other end of the shirt dimension includes a mounting area (a mounting section) for the driver 12 and the flexible printed circuit board 13.

A short-side direction and a long-side direction of the liquid crystal panel 11 correspond to the X-axis direction and the Y-axis direction, respectively. A normal line to a plate surface (a display surface) of the liquid crystal panel 11 corresponds to the Z-axis direction. An edge portion of the flexible printed circuit board 13 opposite from the liquid crystal panel 11 is connected to a control board 14 (a control circuit board) that is a signal supply source. In FIG. 1, a dot-and-dashed line box indicates an outline of the display section A1 and an area outside the dot-and-dashed line is the non-display section A2. The driver 12 is an LSI chip including drive circuits therein. The driver 12 is configured to operate according to signals supplied by the control board 14 to process the input signal supplied by the control board 14, to generate output signals, and to output the output signals to the display section A1 in the liquid crystal panel 11. The driver 12 has a laterally-long rectangular shape (an elongated shape that extends along the short side of the liquid crystal panel 11) in a plan view. The driver 12 is directly connected to the non-display section A2 of the liquid crystal panel 11 (the array board 30), that is, mounted by the chip-on-glass (COG) mounting method.

The flexible printed circuit board 13 includes a base member made of synthetic resin having insulating property and flexibility (e.g., polyimide resin). A number of traces are formed on the base member (not illustrated). The end of the long dimension of the flexible printed circuit board 13 is connected to the control board 14 and the other end of the long dimension of the flexible printed circuit board 13 is connected to the liquid crystal panel 11 (the array board 30). The flexible printed circuit board 13 is bent or folded back inside the liquid crystal display device such that a cross-sectional shape thereof forms a U-like shape. At the ends of the long dimension of the flexible printed circuit board 13, portions of the traces are exposed to the outside and configured as terminals (not illustrated). The terminals are electrically connected to the control board 14 and the liquid crystal panel 11. With this configuration, input signals supplied by the control board 14 are transmitted to the liquid crystal panel 11.

The control board 14 is mounted on the back surface of the backlight unit. The control board 14 includes a substrate made of paper phenol or glass epoxy resin and electronic components mounted on the substrate and configured to supply various input signals to the driver 12. Traces (electrically conductive paths) which are not illustrated are formed in predetermined patterns on the substrate. One end of the flexible printed circuit board 13 is electrically and mechanically connected to the control board 14 via an anisotropic conductive film (ACF), which is not illustrated.

Figure 2:
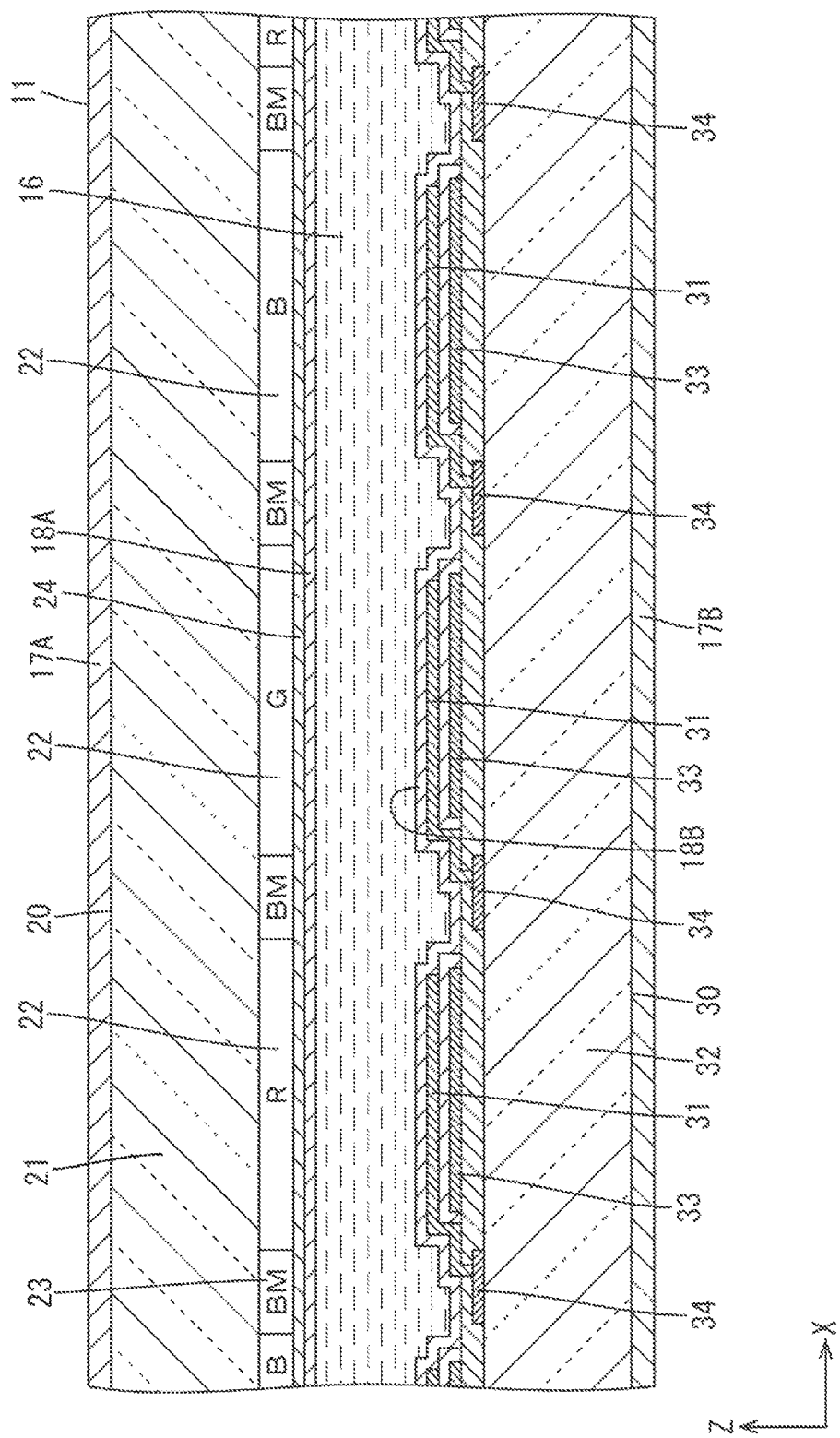
FIG. 2 is a general cross-sectional view illustrating a structure of a display section of the liquid crystal panel.

As illustrated in FIG. 2, the liquid crystal panel 11 includes a pair of transparent substrates 20, 30, and a liquid crystal layer 16 (a medium layer) between the substrates 20 and 30. The liquid crystal layer 16 includes liquid crystal molecules having optical characteristics that vary according to application of electric field. The liquid crystal layer 16 is surrounded and sealed by a sealing section (not illustrated) that is between the substrates 20 and 30. The substrates 20, 30 include a CF board 20 (a counter board, a color filter board) on the front (front surface side) and an array board 30 (a display board, an active matrix substrate, a component substrate) 11b on a back side (back surface side). Polarizing plates 17A, 17B are bonded to outer surfaces of the substrates 20 and 30, respectively. Alignment films 18A, 18B are formed on inner surfaces of the substrates 20 and 30, respectively, for aligning the liquid crystal molecules included in the liquid crystal layer 16. The alignment films 18A, 18B are contacted with the liquid crystal layer 16.

Figure 3:
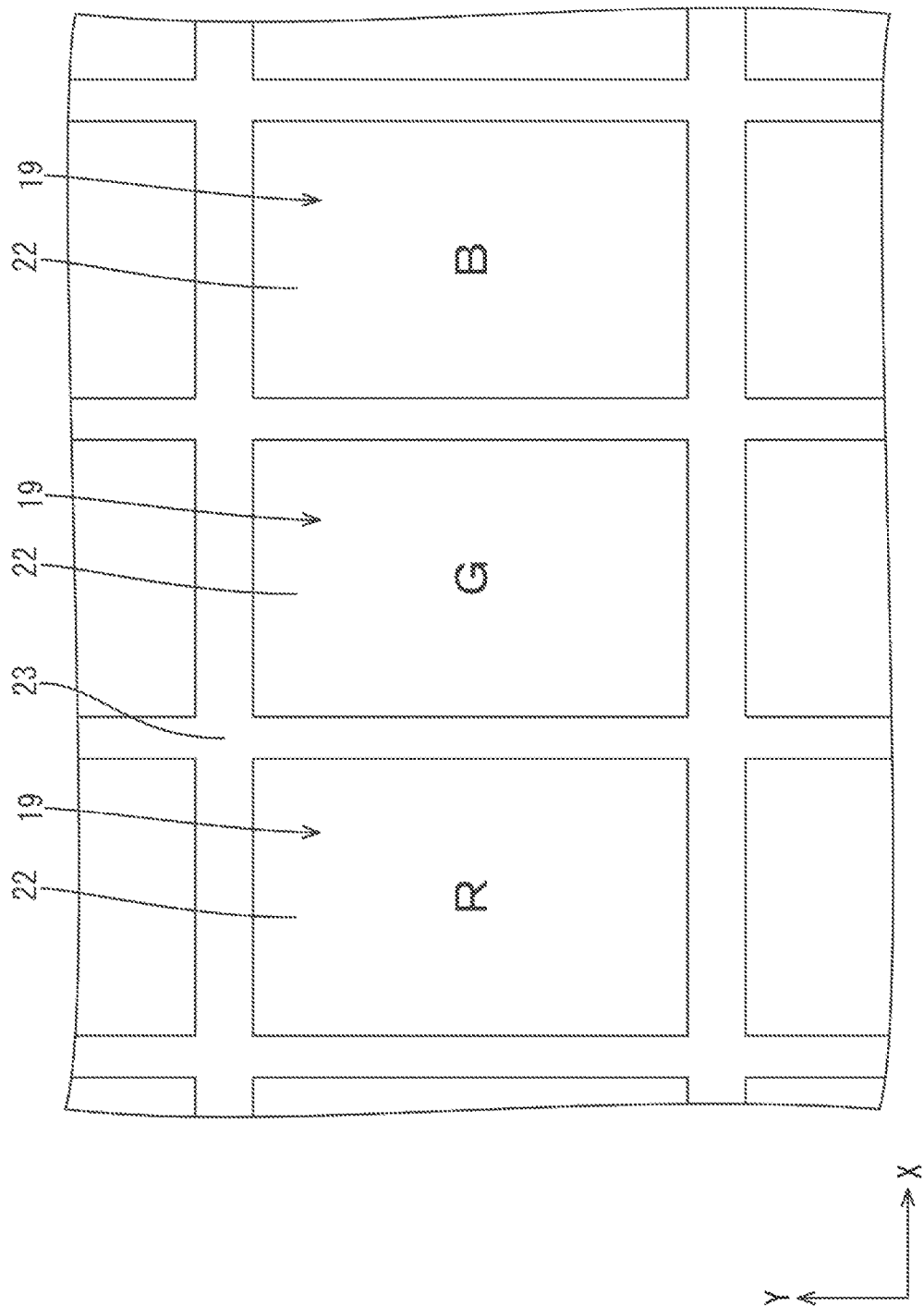
FIG. 3 is a general plan view illustrating a configuration of a display section of a CF board included in the liquid crystal panel.

The CF board 20 includes a glass substrate 21 made of glass and various kinds of films disposed in layers on an inner surface of the glass substrate 21. As illustrated in FIGS. 2 and 3, color filters 22 are formed on an inner surface side of the CF board 20 in the display section A1 so as to be opposite pixel electrodes 31 (which will be illustrated later) on the array board 30 side. The color filters 22 include red (R), green (G), and blue (B) color portions that are arranged in a matrix and in a repeated manner. The color portions (pixels 19) arranged in a matrix and included in the color filters 22 are defined by a light blocking section 23 (a black matrix). Light rays of different colors transmitting through the color portions are less likely to be mixed (color mixture) by the light blocking section 23.

As illustrated in FIG. 2, an overcoat film (a flattening film) 24 is formed on surfaces of the color filters 22 and the light blocking section 23. In the liquid crystal panel 11, the color portion of the color filter 22 and the pixel electrode 31 opposite the color portion form one pair that is one pixel 19. Specifically, the liquid crystal panel 11 includes a pixel 19 (red pixel) including a red color portion of the color filter 22, a pixel 19 (green pixel) including a green color portion of the color filter 22, and a pixel 19 (blue pixel) including a blue color portion of the color filter 22. The pixels 19 of three colors are arranged in repeated sequence along the row direction (the X-axis direction) on the plate surface of the liquid crystal panel 11 and form a pixel group. The pixel groups are arranged in the column direction (the Y-axis direction). Namely, the pixels 19 are arranged in a matrix within the display section A1 of the liquid crystal panel 11.

Figure 4:
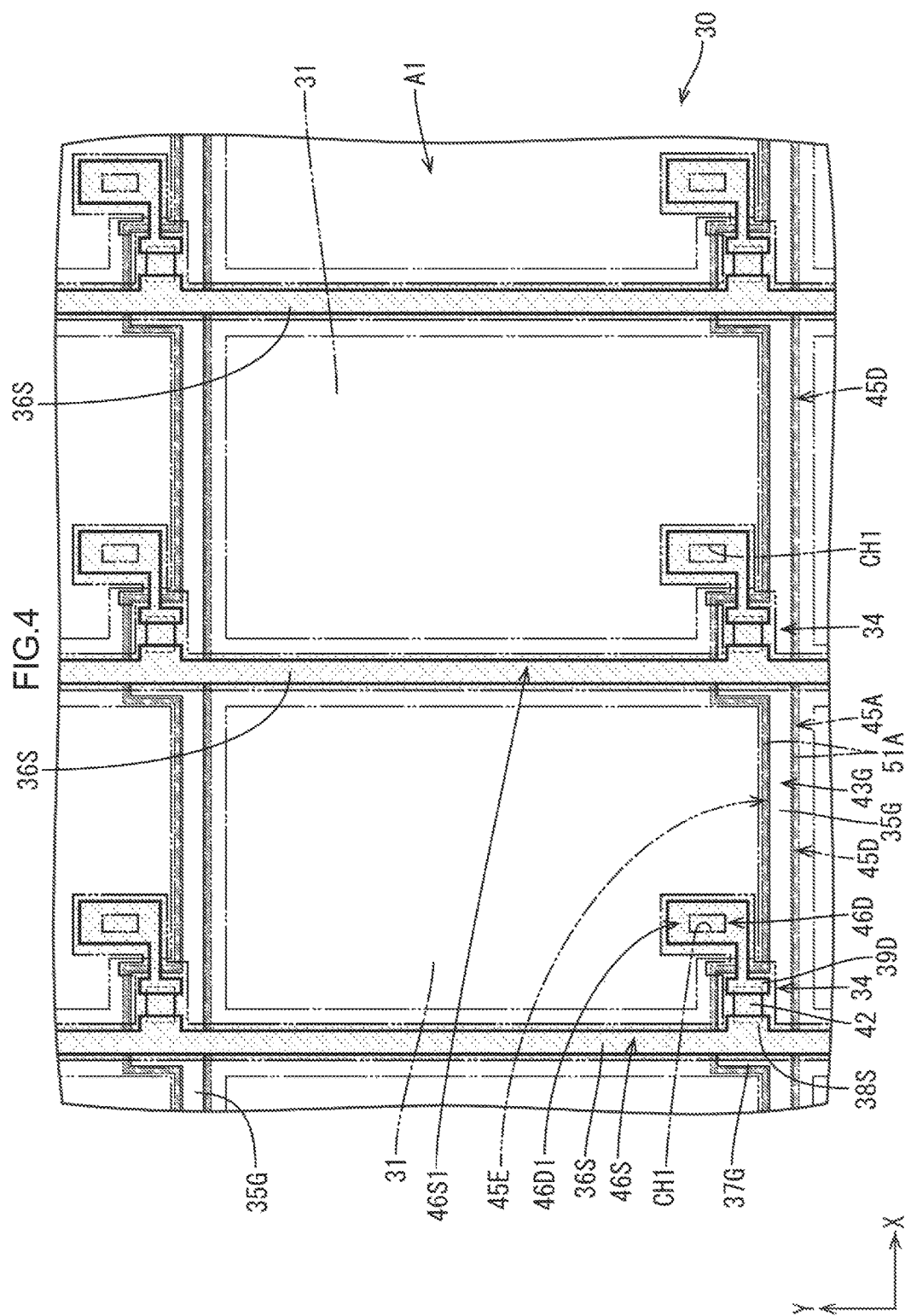
FIG. 4 is a general plan view illustrating a configuration of a display section of an array board included in the liquid crystal panel.

Next, a configuration of the array board 30 (display panel board) will be described. The array board 30 includes a glass substrate 32 made of glass and various films formed in layers on the inner surface side of the glass substrate 32 with the known photolithography method. As illustrated in FIG. 4, a number of TFTs 34 (thin film transistors: display components) that are switching components and a number of pixel electrodes 31 (a two-dot and dashed line in FIG. 4) are arranged in a matrix in the display section A1 on the inner surface of the array board 30 (the liquid crystal layer 16 side, the opposed surface side opposed to the CF board 20). Furthermore, the gate lines (scan lines) 35G and the source lines 36S (data lines, signal lines, component tracing section) are arranged in a grid to surround the TFTs 34 and the pixel electrodes 31.

Figure 5:
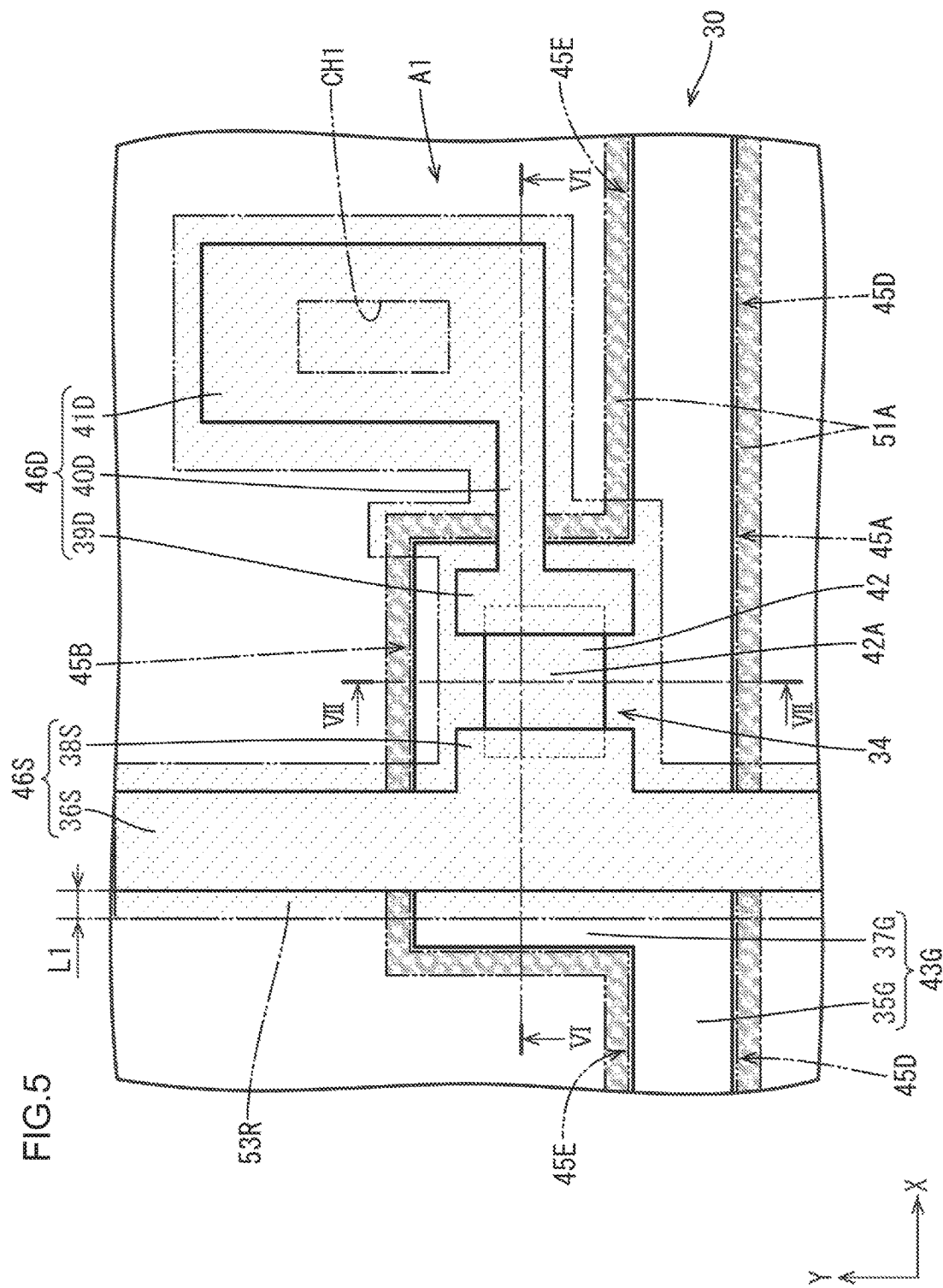
FIG. 5 is an enlarged plan view illustrating a vicinity of a TFT in FIG. 4.

As illustrated in FIGS. 4 and 5, the TFT 34 includes a gate electrode 37G, a source electrode 38S, and a drain electrode 39D. The gate line 35G is connected to the gate electrode 37G and the source line 36S is connected to the source electrode 38S. The drain electrode 39D is connected to one end of a drain line 40D. A component connection section 41D connected to the pixel electrode 31 is formed at another end of the drain line 40D integrally with the drain line 40D. The TFT 34 includes a channel section 42A that connects the drain electrode 39D and the source electrode 38S. The TFT 34 is driven based on various kinds of signals supplied to the gate line 35G and the source line 36S and supply of a potential to the pixel electrode 31 is controlled according to the driving of the TFT 34. In this embodiment, an extending direction of the gate line 35G matches the X-axis direction and an extending direction of the source line 36S matches the Y-axis direction in each drawing.

As illustrated in FIG. 4, the pixel electrode 31 is arranged in a rectangular area surrounded by the gate lines 35G and the source lines 36S and has slits (not illustrated). As illustrated in FIG. 2, a common electrode 33 is disposed on a rear side of the pixel electrode 31 included in the array board 30. If potential difference is generated between the pixel electrode 31 and the common electrode 33, a fringe field (an oblique field) including a component in a direction normal to a plate surface of the array board 30 is applied to the liquid crystal layer 16 in addition to a component in a direction along the plate surface of the array board 30. Namely, a driving type of the liquid crystal panel 11 is a fringe filed switching (FFS) type.

Figure 6:
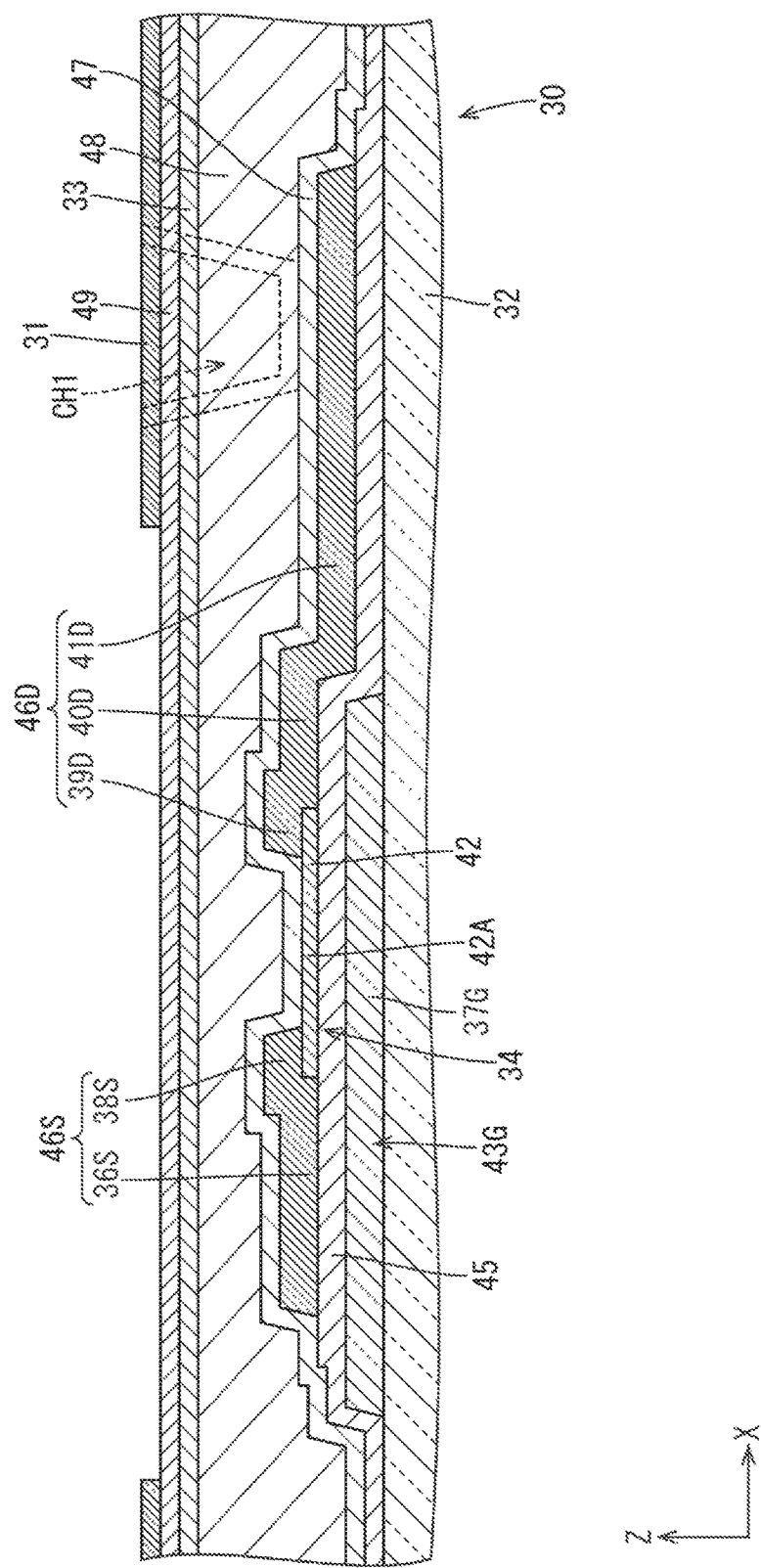
FIG. 6 is a cross-sectional view of the vicinity of the TFT (a cross sectional view taken along line VI-VI in FIG. 5).
Figure 7:
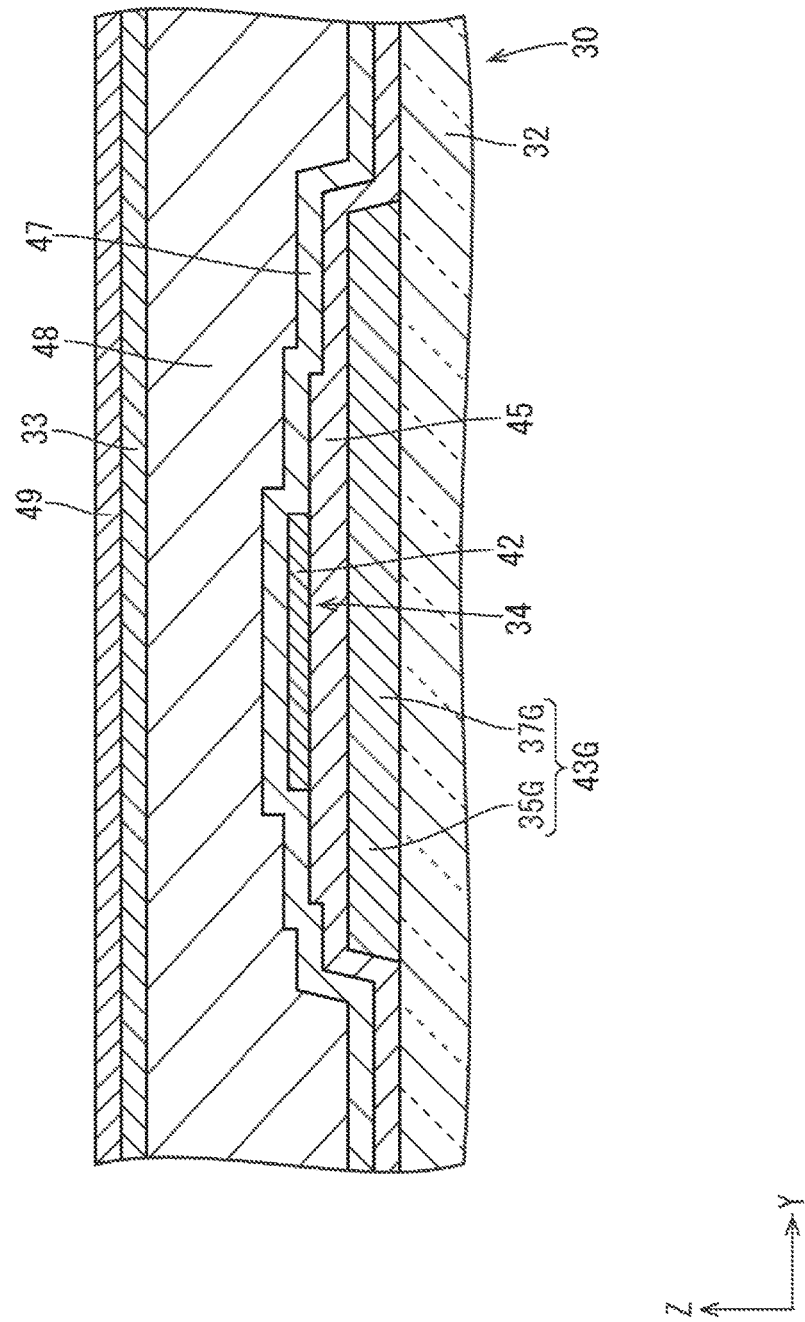
FIG. 7 is a cross-sectional view of the vicinity of the TFT (a cross sectional view taken along line VII-VII in FIG. 5).

Next, the various films formed in layers on the glass substrate 32 (substrate) of the array board 30 will be described in detail. As illustrated in FIGS. 6 and 7, on the glass substrate 32, the following films are formed in the following sequence from the lowest layer (the glass substrate 32 side): a gate conductive film 43G, a gate insulation film 45, a semiconductor film 42, a source conductive film 46S (and a drain conductive film 46D), a first interlayer insulation film 47, a flattening film 48, a common electrode 33 (a transparent electrode film), a second interlayer insulation film 49, and a pixel electrode 31 (a transparent electrode film) are at least formed in layers. The alignment film 18A that is included in an upper layer of the pixel electrode 31 is not illustrated in FIGS. 6 and 7.

The gate conductive film 43G forms the gate electrodes 37G and the gate lines 35G. The gate conductive film 43G is a layered film of three layers of titanium (Ti), aluminum (Al), and titanium (Ti). The gate insulation film 45 is made of silicon oxide ($SiO_2$) that is inorganic material. The gate insulation film 45 is present between the gate conductive film 43G and the source conductive film 46S (or the drain conductive film 46D) and insulation is established therebetween.

The semiconductor film 42 is formed on the gate insulation film 45 while overlapping the gate electrode 37G and is a thin film including oxide semiconductors. The semiconductor film 42 mainly forms the channel section 42A of the TFT 34. The TFT 34 of this embodiment does not include an etch stopper layer on the channel section 42A and lower surfaces of the source electrode 38S and the drain electrode 39D are directly in contact with an upper surface of the semiconductor film 42.

The oxide semiconductors included in the oxide semiconductor film 42 may be amorphous or crystalline having crystalline qualities. The oxide semiconductors having the crystalline qualities may be polycrystalline oxide semiconductors, macrocrystalline oxide semiconductors, or crystalline oxide semiconductors where c-axis is oriented substantially vertical to a layer surface. The oxide semiconductor film 42 may have a multilayer structure including two or more layers. The oxide semiconductor film 42 having a multilayer structure may include an amorphous oxide semiconductor layer and crystalline oxide semiconductor layer, or may include crystalline oxide semiconductor layers having different crystal structures. The oxide semiconductor film 42 may include amorphous oxide semiconductor layers. In a two-layer structure of the oxide semiconductor film 42 including an upper layer and a lower layer, an energy gap of the oxide semiconductors included in the upper layer is preferably greater than an energy gap of the oxide semiconductors included in the lower layer. If the difference between the energy gaps of the layers is relatively small, the energy gap of the oxide semiconductors included in the lower layer may be greater than the energy gap of the oxide semiconductors included in the upper layer.

Material, structures, and film forming methods of amorphous oxide semiconductors and each of the above crystalline semiconductors and configurations or the oxide semiconductor flint 42 having a multilayer structure are described in Japanese Patent Unexamined Publication Application No. 2014-007399. For reference, the entire content of JPA 2014-007399 is hereby incorporated by reference. The oxide semiconductor film 42 may include at least one of metallic elements of In, Ga, and Zn. In this embodiment, the oxide semiconductor film 42 contains In—Ga—Zn—O semiconductors containing indium (In), gallium (Ga), zinc (Zn), and oxide (O) as main components. The In—Ga—Zn—O semiconductors are ternary oxide of indium (In), gallium (Ga), and zinc (Zn), and the ratio (composition ratio) of In, Ga, and Zn is not particularly limited but may be In:Ga:Zn=2:2:1, In:Ga:Zn=1:1:1, or In:Ga:Zn=1:1:2. The oxide semiconductor film 42 is formed from an oxide semiconductor film containing In—Ga—Zn—O semiconductors. The In—Ga—Zn—O semiconductors may be amorphous or crystalline having crystalline qualities. The oxide semiconductors having the crystalline qualities may preferably be crystalline In—Ga—Zn—O semiconductors where c-axis is oriented substantially vertical to a layer surface.

A crystal structure of the crystalline In—Ga—Zn—O semiconductors is described in Japanese Patent Unexamined Publication Application No. 2014-007399, Japanese Patent Unexamined Publication Application No. 2012-134475, or Japanese Patent Unexamined Publication Application No. 2014-209727. For reference, the entire contents of JPA 2012-134475 and JPA 2014-209727 are hereby incorporated by reference. The TFTs including the In—Ga—Zn—O semiconductor layer have high electron mobility (higher than that of an a-SiTFT, for example, 20 times higher or more) and low leakage current (less than $\frac{1}{100}$ compared to that of an a-SiTFT). The TFTs including the In—Ga—Zn—O semiconductor layer are preferably used as driving TFTs (TFTs included in the driver circuit disposed on the substrate same as the display area near the display area including the display pixels) and the TFTs (TFTs included in the pixels).

The oxide semiconductor film 42 may include other oxide semiconductors instead of the In—Ga—Zn—O semiconductors. For example, the oxide semiconductor film 42 may include In—Sn—Zn—O semiconductors (such as $In_2O_3$—$SnO_2$—ZnO; InSnZnO). The In—Sn—Zn—O semiconductors are ternary oxide of indium (In), tin (Sn), and zinc (Zn). The oxide semiconductor film 42 may include In—Al—Zn—O semiconductors, In—Al—Sn—Zn—O semiconductors, Zn—O semiconductors, In—Zn—O semiconductors, Zn—Ti—O semiconductors, Cd—Ge—O semiconductors, Cd—Pb—O semiconductors, cadmium oxide (CdO), Mg—Zn—O semiconductors, In—Ga—Sn—O semiconductors, In—Ga—O semiconductors, Zr—In—Zn—O semiconductors, or Hf—In—Zn—O semiconductors.

The source conductive film 46 and the drain conductive film 46D are formed on the gate insulation film 45. The source conductive film 46S forms the source line 36S and the source electrode 38S. The drain conductive film 36D forms the drain electrode 39D, the drain line 40D, and the component connection section 41D. The source conductive film 46S and the drain conductive film 46D are made of same material and is a multilayer film including three layers such as a titanium (Ti) layer, an aluminum (Al) layer, and a titanium layer, for example.

The first interlayer Insulation film 47 is arranged at least on the source conductive film 46S (and the drain conductive film 46D) and is made of silicon oxide ($SiO_2$), which is inorganic material. The flattening film 48 is disposed on the first interlayer insulation film 47 and made of acrylic resin such as polymethyl methacrylate resin (PMMA), which is organic material. The first interlayer insulation film 47 and the flattening film 48 are present between the common electrode 33 and the thin films (the source conductive film 46S, the drain conductive film 46D, and the semiconductor film 42) that are included in a lower layer than the common electrode 33 to establish insulation therebetween. The flattening film 48 is an organic insulation film and has a film thickness relatively greater than those of the inorganic insulation films (the first inter layer insulation film 47 and the second interlayer insulation film 49). The flattening film 49 has a function of flattening a surface.

The common electrode 33 is arranged on the flattening film 48 and is made of transparent electrode material such as indium tin oxide (ITO) or line oxide (ZnO). The second interlayer insulation film 49 is arranged at least on the common electrode 33 and is made of silicon nitride ($SiN_x$) which is inorganic material. The second interlayer insulation film 49 is present between the common electrode 33 and the pixel electrode 31 and establishes insulation thereberween. The pixel electrode 31 is arranged on the second interlayer insulation film 49 and is made of transparent electrode material such as indium tin oxide (ITO) or zinc oxide (ZnO). Holes such as a contact hole CH1 (refer a broken line in FIG. 6) is formed at a position in the first interlayer insulation film 47 and the flattening film 48 overlapping the component connection section 41D. The pixel electrode 31 is connected to the component connection section 41D through the contact hole CH1. Materials of each of the thin films disposed on the glass substrate 32 in layers are not limited to the above described ones and may be altered, if necessary.

Method of Producing Liquid Crystal Panel

Next, a method of producing the liquid crystal panel 11 will be described. After the CF board 20 and the array board 30 are produced respectively, the CF board 20 and the array board 30 are bonded to each other and the liquid crystal panel 11 of this embodiment is produced. Hereinafter, the method of producing the array board 30 included in the liquid crystal panel 11 will be described in detail. The method of producing the array board 30 at least includes a gate conductive film forming process of forming the gate conductive film 43G, a gate insulation film forming process of forming the gate insulation film 45, a semiconductor film forming process of forming the semiconductor film 42, a source drain forming process of forming the source conductive film 46S and the drain conductive film 46D, a first interlayer insulation film forming process of forming the first interlayer insulation film 47, a flattening film forming process of forming the flattening film 48, a common electrode forming process of forming the common electrode 33, a second interlayer insulation film forming process of forming the second interlayer insulation film 49, and a pixel electrode forming process of forming the pixel electrode 31.

In each of the above processes, the thin film patterns are formed with the photolithography method. Specifically, each of the above-described processes includes a film forming process of forming a thin film that is a base of the thin film pattern, a resist forming process of forming a resist pattern, and an etching process. In the resist forming process, a resist pattern corresponding to the thin film pattern is formed by performing an exposure process and a developing process for a resist. In the etching process, a thin film pattern is formed by performing etching while using the resist pattern as a mask. The film forming process may be performed with the plasma CVD method, the sputtering method, or the vacuum deposition method according to a type of the thin film. The etching process is performed with wet etching or dry etching appropriately according to a type of the thin film that is to be subjected to etching. The source drain forming process of this embodiment differs from other thin film forming processes in that the resist forming process and the etching process are respectively performed twice. Hereinafter, the source drain forming process will be described in detail.

Source Drain Forming Process

The source drain forming process includes a conductive film forming process, a first resist forming process, a first etching process, a second resist forming process, and a second etching process. In the conductive film forming process, a conductive film 51 that is a base of the source conductive film 46S and the drain conductive film 46D is formed. In the first resist forming process, a resist 52R is formed while following a shape of the source conductive film 46S and the drain conductive film 46D. In the first etching process, the conductive film 51 is processed with etching while using the resist 52R as a mask and the source conductive film 46S and the drain conductive film 46D are formed. In the second resist forming process, a resist 53R is formed to cover the semiconductor film 42, the source conductive film 46S, and the drain conductive film 46D. In the second etching process, the etching is performed to remove the conductive film 51 while using the resist 53R as a mask.

Figure 8:
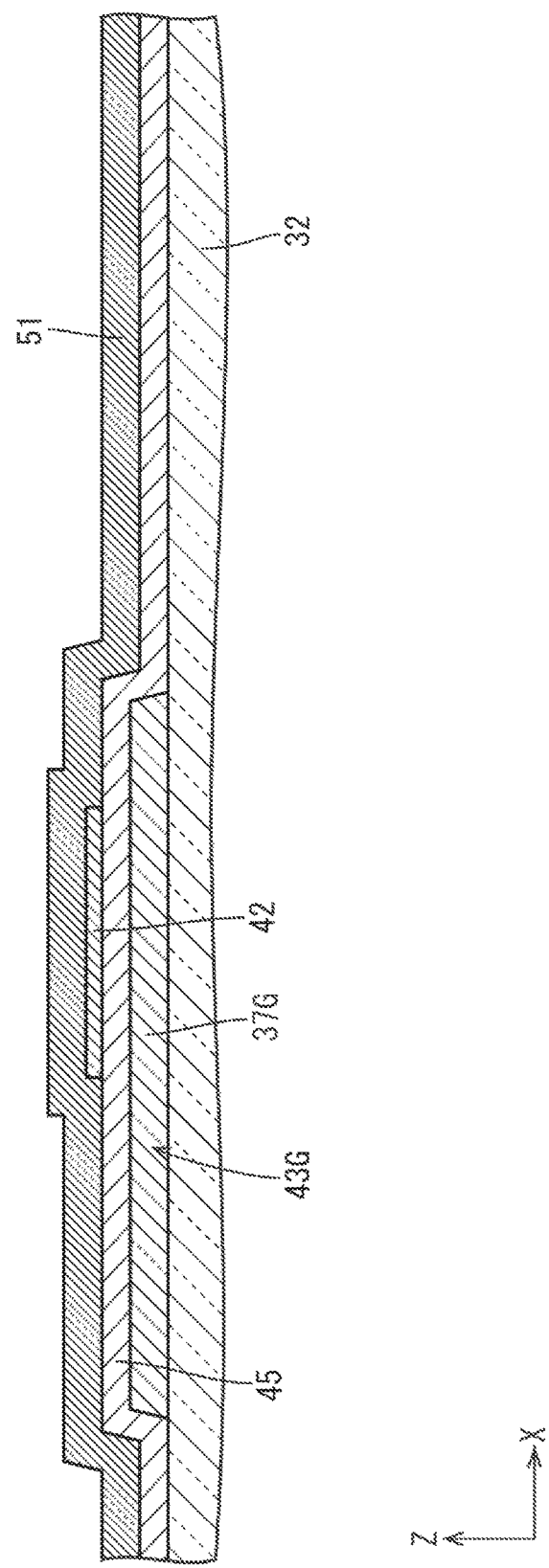
FIG. 8 is a cross-sectional view illustrating a conductive film forming process.
Figure 9:
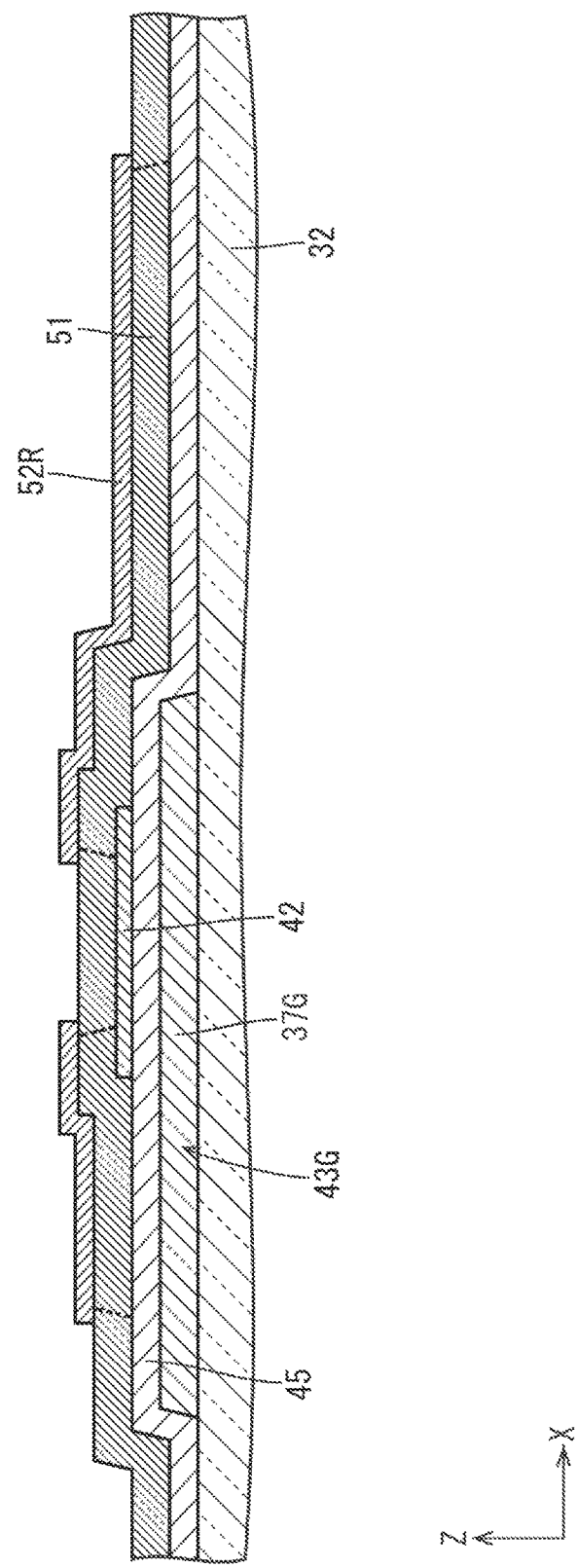
FIG. 9 is a cross-sectional view illustrating a first resist forming process.

As illustrated in FIG. 8, in the conductive film forming process, the conductive film 51 is formed (deposition) while covering the gate insulation film 45 and the semiconductor film 42. The conductive film 51 is deposited in a solid state over an entire area of the display section A1 of the array board 30. In the first resist forming process that is performed after the conductive film forming process, the resist (photoresist) is coated on an upper layer side of the conductive film 51 and the resist is exposed with light via a predetermined photomask. Then, the exposed resist is developed and a patterned resist 52R (resist pattern) is formed. A forming area where the resist 52R is formed substantially matches a forming area where the source conductive film 46S and the drain conductive film 46D are formed.

In the first etching process performed after the first resist forming process, the conductive film 51 is subjected to etching while using the resist 52R as a mask. Accordingly, the portion of the conductive film 51 covered with the resist 52R is not subjected to etching and remains, and the portion of the conductive film 51 not covered with the resist 52R is removed (see FIGS. 9 and 10). Namely, a planar shape of the resist 52R is transferred to the etched conductive film 51 and the source conductive film 46S and the drain conductive film 46D are formed on the conductive film 51. After completion of the first etching process, the resist 52R is removed through a resist stripping process. Any type of etching may be performed as long as the conductive film 51 is removed, and dry etching is performed, for example. However, it is not limited thereto. An etching type may be altered appropriately according to a king of the conductive film 51 or a required dimension precision, and wet etching may be performed. In a configuration of the conductive film 51 including multiple thin films, dry etching and wet etching may be selectively performed according to the type of each thin film.

Figure 11:
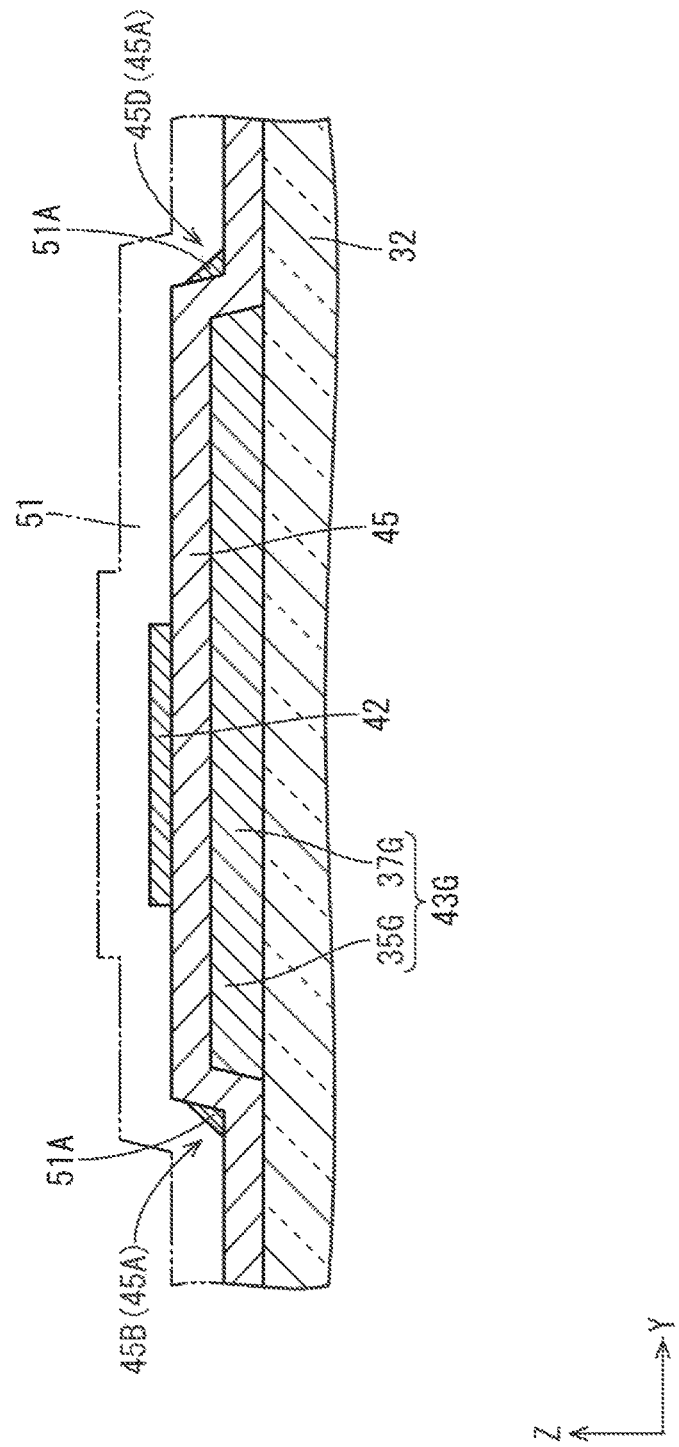
FIG. 11 is a cross-sectional view illustrating a vicinity of the semiconductor film after completion of the first etching process (a cross-sectional view taken along line VII-VII in FIG. 5).

In this embodiment, the gate insulation film 45 is disposed to cover the gate conductive film 43G. Therefore, as illustrated in FIG. 11, the gate insulation film 45 includes step portions 45A due to a thickness of the gate conductive film 43G. The thickness of the resist 52R is likely to be greater at the step portions 45A than other portions. Therefore, when the resist 52R is subjected to patterning, the resist 52R that is to be removed is likely to remain at the step portions 45A.

If the resist 52R remains, the conductive film 51 is not removed with etching at the portion where the resist 52R remains. As a result, a part of the conductive film 51 may remain at the step portion 45A as a residue 51A. Such a residue 51A is likely to be produced as the height of the step portion 45A is greater. As illustrated in FIG. 11, the step portion 45A is tapered and has an inclined surface that is inclined with respect to a plate surface of the glass substrate 32. As an inclination angle of the inclined surface is greater, the residue 51A is more likely to be produced.

The step portion 45A is formed at a section corresponding to a peripheral edge of the gate conductive film 43G, that is specifically a section overlapping the peripheral edge of the gate conductive film 43G in a plan view (or a section slightly outside the peripheral edge). A section where the residue 51A may be produced (the seep portion 45A) is illustrated with dark shading in the plan views of FIGS. 4 and 5. As illustrated in FIG. 5, if the residues 51A are produced, the adjacent source conductive film 46S and the drain conductive film 46D may be connected with the residues 51A. In the first etching process, pairs of the source conductive film 46S and the drain conductive film 46D are formed to be arranged in an extending direction of the gate line 35G (the X-axis direction in FIG. 4). Therefore, as illustrated in FIG. 4, the adjacent two source conductive films 46S may be connected to each other with the residue 51A.

Figure 10:
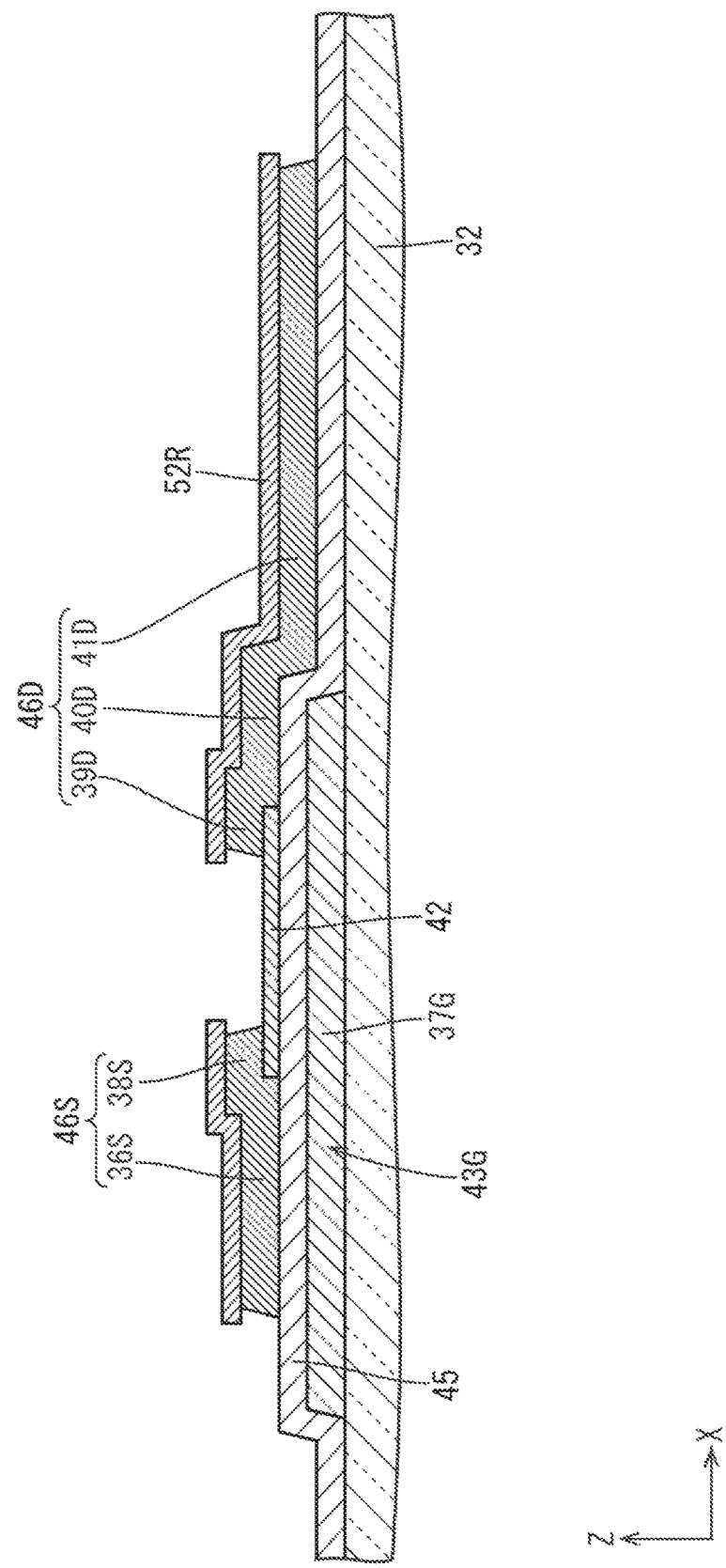
FIG. 10 is a cross-sectional view illustrating a first etching process.

To prevent such production of the residues 51A, the etching time of the etching process of forming the source conductive film 46S and the drain conductive film 46D (see the first etching process) may be set longer. However, as illustrated in FIG. 10, the conductive film 51 that is disposed on the semiconductor film 42 is removed in the etching process such that the source conductive film 46S and the drain conductive film 46D are formed. If the etching time is set longer, the semiconductor film 42 may be adversely affected by the etching and the characteristics of the semiconductor film 42 may be changed. Therefore, in this embodiment, the second resist forming process and the second etching process are performed after the first etching process to remove the residues 51A of the conductive film 51 while protecting the semiconductor film 42.

Figure 12:
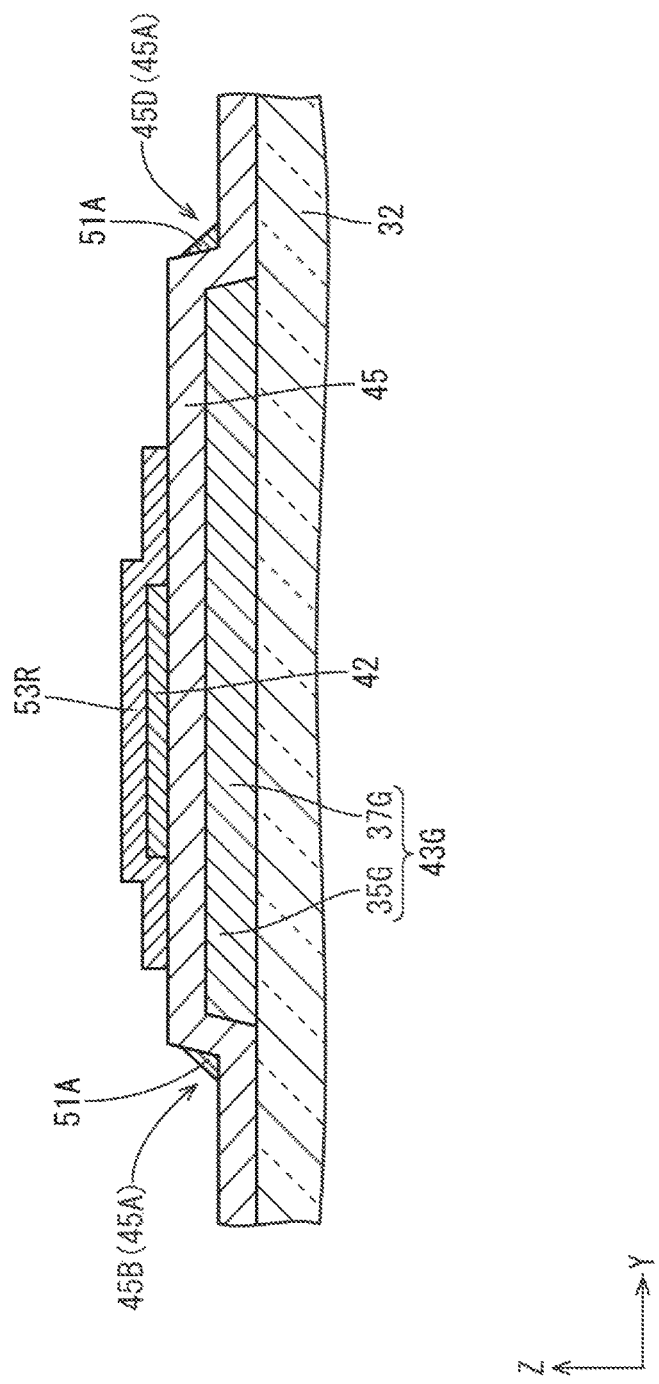
FIG. 12 is a cross-sectional view illustrating a second resist forming process.

In the second resist forming process (one example of the resist forcing process), the resist (a photoresist) is disposed on the semiconductor film 42, the source conductive film 46S, and the drain conductive film 46D with coating. Then, the resist is exposed with light via a predetermined photomask and the exposed resist is developed so that the patterned resist 53R (a resist pattern) is formed as illustrated in FIGS. 5 and 12. As illustrated in FIG. 5, the resist 53R covers the semiconductor film 42, the source conductive film 46S, and the drain conductive film 46D. In the plan view of FIG. 5, the patterned resist 53R is illustrated with bright shading and a peripheral edge of the resist 53R is illustrated with a two-dot and dashed line. Specifically, in the plan view of FIG. 5, the resist 53R is disposed to follow the shape of the semiconductor film 42, the source conductive film 46S, and the drain conductive film 46D. The resist 53R has a plan view shape slightly greater than that of the source conductive film 46S and the drain conductive film 46D. A distance L1 from the peripheral edge of the source conductive film 46S (or the drain conductive film 46D) to the peripheral edge of the resist 53R is 1 μm, for example. However, the distance L1 is not limited to the value and may be altered, if necessary.

The resist 53R is formed not to be disposed on a part of the step portion 45A extending along the peripheral edge of the gate conductive film 43G where a short-circuit may be caused due to the generation of the residue 51A. Specifically, as illustrated in FIGS. 4 and 5, the resist 53R is formed not to be disposed on three extending portions 45B, 45D, 45E of the step portion 45A. As illustrated in FIG. 5, the extending portion 45E is a portion (an L-shaped portion) of the step portion 45A extending between the source conductive film 46S and the drain conductive film 46D that are connected with the semiconductor film 42.

The extending portion 45D (a source in-between extending portion) of the step portion 45A extends from one to another of the two adjacent source conductive films 46S. The extending portion 45E (an opposite-side extending portion) of the step portion 45A extends from the drain conductive film 46D to the source conductive film 46S (for example, 46S1 in FIG. 4) that is not connected to the drain conductive film 46D (for example, 46D1 in FIG. 4) via the semiconductor film 42. Namely, the source conductive film 46S1 (an example of an opposite-side source conductive film) is one of the two source conductive films 46S that are arranged to have the drain conductive film 46D therebetween, and the one of the two source conductive films 46S is disposed on an opposite side from the source conductive film 46S that is connected to the drain conductive film 46D via the semiconductor film 42. The resist 53R is formed not to be disposed on at least a part of the extending portion 45B in the extending direction. Namely, the resist 53R is disposed such that a part of the peripheral edge thereof crosses the extending portion 45B. According to such a configuration, even if the residue 51A is produced along the longitudinal direction of the extending portion 45B, the residue 51A is cut in the second etching process, which will be described later. The resist 53R is formed not to be disposed on at least a part of the extending portions 45D, 45E, respectively, similar to the extending portion 45B.

Figure 13:
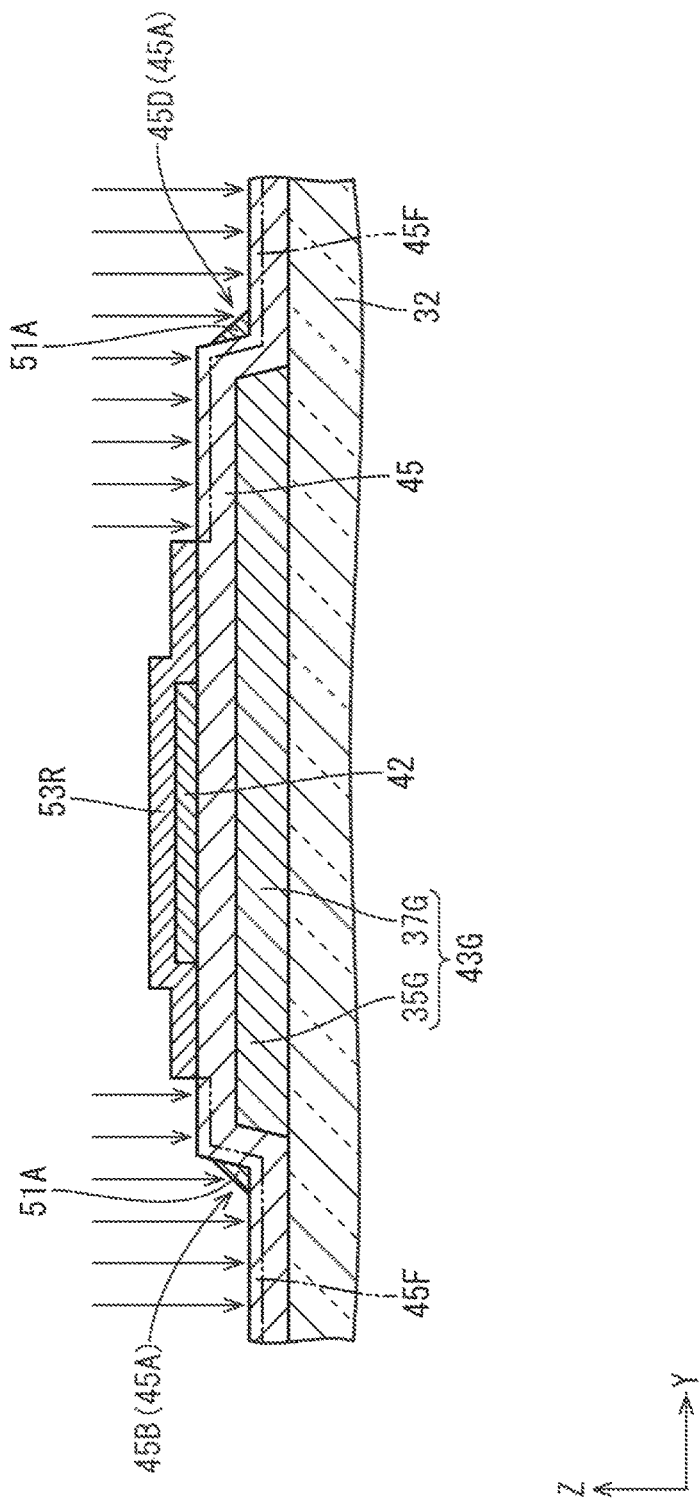
FIG. 13 is a cross-sectional view illustrating a second etching process.
Figure 14:
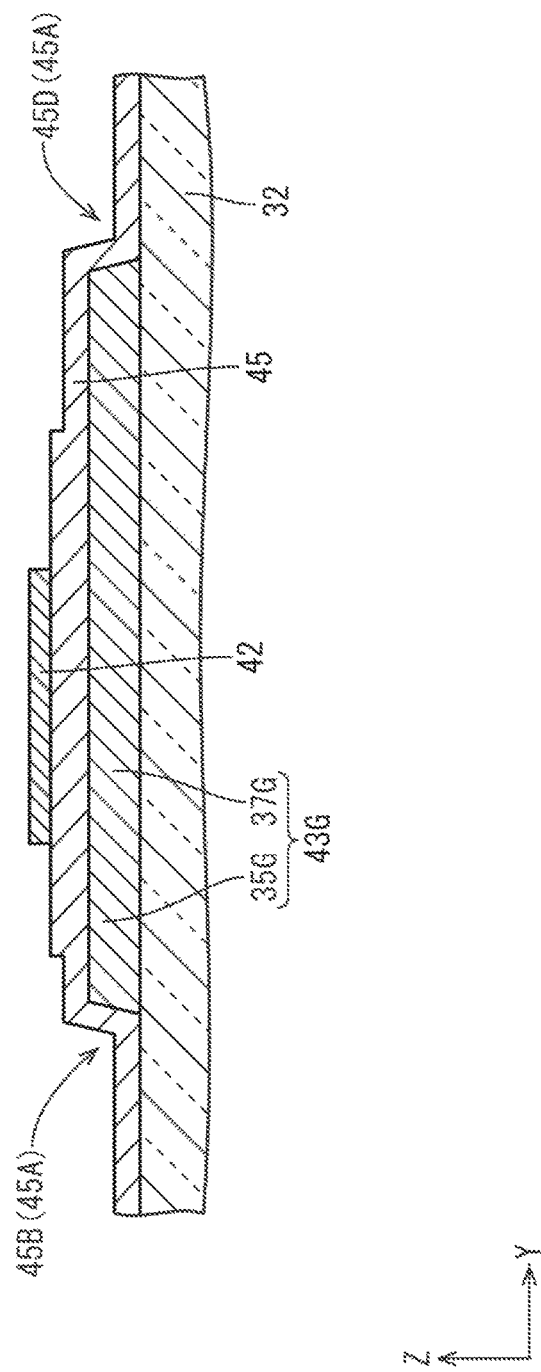
FIG. 14 is a cross-sectional view illustrating a vicinity of the semiconductor film after completion of the second etching process.

In the second etching process, as illustrated in FIG. 13, etching is performed to remove the conductive film 51 while using the resist 53R as a mask. Specifically, for example, the same type of etching as that performed in the first etching process is performed. However, it is not limited thereto. Thus, as illustrated in FIG. 14, the residues 51A at the step portions 45A are removed. The resist 53R is stripped off in the resist stripping process after completion of the first etching process. In the second etching process, etching is performed until a part 45F of the gate insulation film 45 (illustrated with a two-dot dashed line in FIG. 13) is removed so that the residues 51A of the conductive film 51 can be surely removed.

Next, advantageous effects of this embodiment will be described. As described before, this embodiment includes the conductive film forming process, the first etching process performed after the conductive film forming process, the resist forming process performed after the first etching process, and the second etching process performed after the resist forming process. In the conductive film forming process, the conductive film 51 is formed to cover the gate insulation film 45 that covers the gate electrode 37G and the gate line 35G formed on the glass substrate 32 and also cover the semiconductor film 42 that is disposed on the section of the gate insulation film 45 overlapping the gate electrode 37G. In the first etching process, the conductive film 51 is subjected to etching so that the source conductive film 46S including the source electrode 38S connected to the semiconductor film 42 and the drain conductive film 46D including the drain electrode 39D connected to the semiconductor film 42 are formed. In the resist forming process, the resist 53R covering the semiconductor film 42, the source conductive film 46S, and the drain conductive film 46D is formed. In the second etching process, the etching for removing the conductive film 51 is performed while using the resist 53R as a mask.

The step portions 45A are produced at the portions of the gate insulation film 45 overlapping the peripheral edge of the gate electrode 37G and also at the portions thereof overlapping the peripheral edge of the gate line 35G due to the thickness of the gate electrode 37G and the gate line 35G. If the source conductive film 46S and the drain conductive film 46D are formed on the gate insulation film 45 with etching, the conductive film 51 is less likely to be removed at the step portions 45A of the gate insulation film 45 and the residues 51A of the conductive film 51 may be produced. In this embodiment, after the source conductive film 46S and the drain conductive film 46D are formed in the first etching process, the resist 53R that covers the source conductive film 46S and the drain conductive film 46D is formed and the etching for removing the conductive film 51 is performed (the second etching process). Accordingly, even if the conductive film 51 remains at the step portion 45A of the gate insulation film 45, the remaining conductive film 51 can be removed. Since the semiconductor film 42 is covered with the resist 53R, the semiconductor film 42 can be protected from etching in the second etching process.

In the resist forming process, among the step portions 45A formed on the gate insulation film 45, the resist 53R is formed so as not to be disposed on at least a part of the extending portion 45B extending from the source conductive film 46S to the drain conductive film 46D.

If the residue 51A of the conductive film 51 is produced at the extending portion 45B, the source electrode 38S and the drain electrode 39D may be electrically connected to each other via the residue 51A of the conductive film 51. In this embodiment, the resist 53R is formed except for at least a part of the extending portion 45B. Accordingly, even if the residue 51A connecting the source conductive film 46S and the drain conductive film 46D is produced at the extending portion 45B, the residue 51A can be removed (cut) in the second etching process and the source electrode 38S and the drain electrode 39D are not electrically connected to each other via the residue 51A.

In the first etching process, the source conductive films 46S and the drain conductive films 46D are arranged in the extending direction of the gate line 35G. In the resist forming process, the resist 53R is formed except for at least a part of the extending portion 45D of the step portion 45A formed on the gate insulation film 45, and the extending portion 45D extends from one to another of the adjacent two source conductive films 46S.

The residue 51A of the conductive film 51 that is produced between the two adjacent source conductive films 46S can be removed in the second etching process, and the two adjacent source conductive films 46S are less likely to be electrically connected to each other via the residue 51A of the conductive film 51.

In the first etching process, the source conductive films 46S and the drain conductive films 46D are formed to be arranged in the extending direction of the gate line 35G. Out of the two source conductive films 46S having the drain conductive film 46D therebetween, one source conductive film 46S arranged on an opposite side from the other source conductive film 46S connected to the drain conductive film 46D via the semiconductor film 42 is the source conductive film 46S1. In such a configuration, the resist 53R is formed not to be disposed on at least a part of the extending portion 45E of the step portion 45A formed on the gate insulation film 45 in the resist forming process, and the extending portion 45E extends from the drain conductive film 46D to the source conductive film 46S1.

Even if the residue 51A connecting the drain conductive film 46D and the source conductive film 46S1 is produced, the residue 51A is removed in the second etching process, and the drain conductive film 46D and the source conductive film 46S1 are less likely to be electrically connected to each other via the residue 51A of the conductive film 51.

In the resist forming process, the resist 53R is formed to follow a shape of the source conductive film 46S and the drain conductive film 46D. Accordingly, for the source conductive film 46S and the drain conductive film 46D, substantially same portions as those removed in the first etching process can be removed in the second etching process. Over-etching is generally performed to surely remove unnecessary conductive film in forming the source conductive film 46S and the drain conductive film 46D with etching. In this embodiment, etching time (specifically, time of performing the over-etching) in the first etching process is shortened and the etching for the shortened etching time can be performed in the second etching process. Accordingly, in the first etching process where the semiconductor film 42 is not covered with the resist, the semiconductor film 42 is less likely to be adversely affected by the over-etching, and in the second etching process where the semiconductor film 42 is covered with the resist, the etching is effectively performed while protecting the semiconductor film 42.

The gate electrode 37G and the gate line 35G are configured to contain aluminum. The gate electrode 37G and the gate line 35G containing aluminum reduce cost compared to a configuration containing copper. However, aluminum is greater in electric resistance than copper. Therefore, in the configuration including the gate electrode 37G and the gate line 35G containing aluminum, the gate electrode 37G and the gate line 35G are preferably made thicker than those containing copper to decrease electric resistance. As the gate electrode 37G and the gate line 35G are thicker, the step portion 45A of the gate insulation film 45 is increased in height thereof due to the increased thickness of the gate electrode 37G and the gate line 35G. Therefore, the residue 51A of the conductive film 51 is more likely to be produced. In this embodiment, the residue 51A of the conductive film 51 can be removed in the second etching process. Therefore, this embodiment is preferable for the configuration including the gate electrode 37G and the gate line 35G containing aluminum.

Second Embodiment

Figure 15:
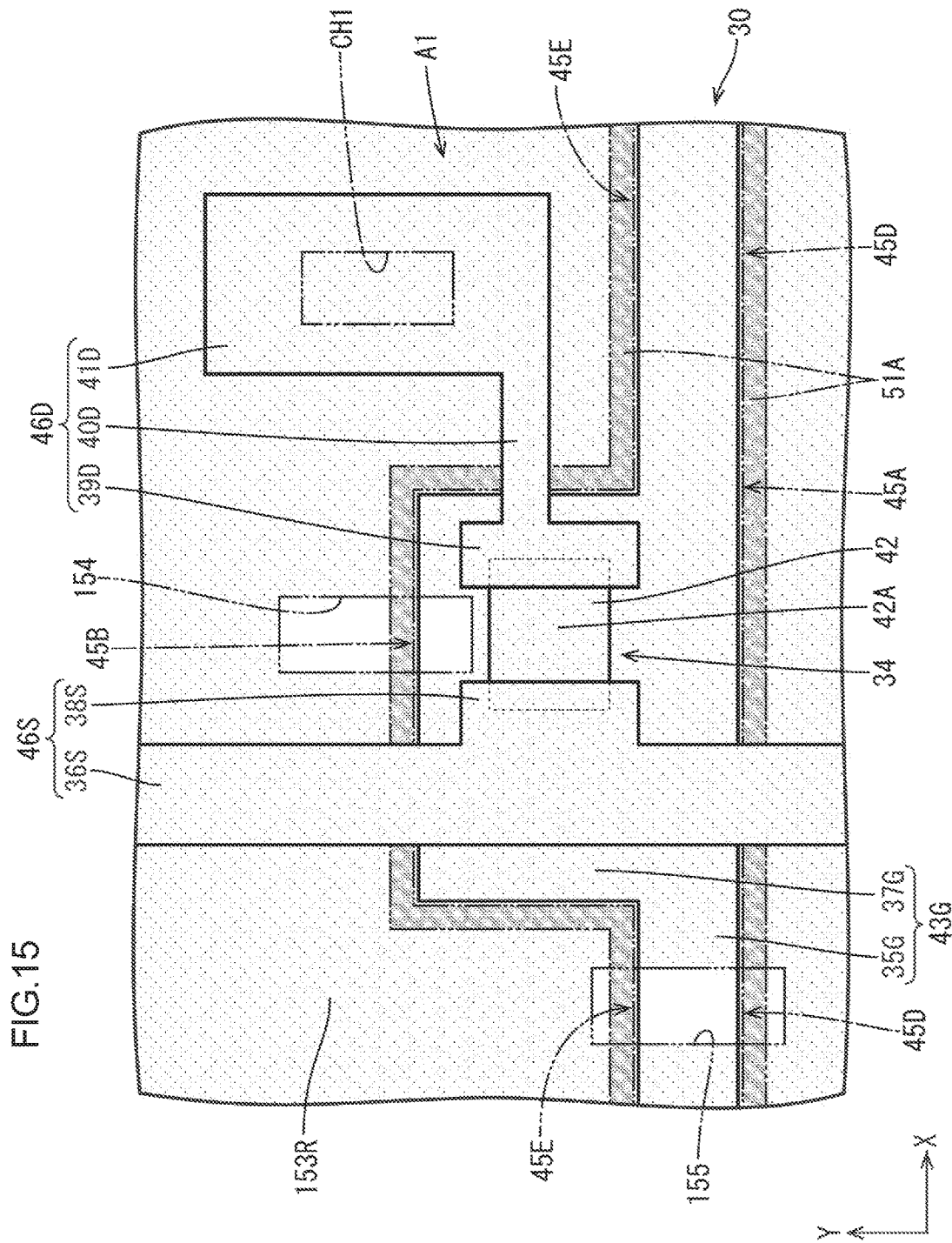
FIG. 15 is a plan view illustrating a resist according to a second embodiment of the present invention.

Next, a second embodiment of the present invention will be described with reference to FIG. 15. In the second embodiment, a forming area of the resist formed in the second resist forming process differs that of the first embodiment. Same parts as those in the above embodiment are provided with the same symbols and will not be described. As illustrated in FIG. 15, a resist 153R (a resist pattern, a section with bright shading in FIG. 15) that is formed in the second resist forming process is formed in an entire area of the display section A1 of the array board 30 and has two kinds of holes 154, 155. Each of the holes 154 and 155 is formed for each pixel 19. However, it is not limited thereto.

The hole 154 is rectangular and crosses the extending portion 45B of the step portion 45A in a plan view. The hole 154 is formed for removing the residue 51A of the conductive film 51 produced at the extending portion 45B. The hole 155 is rectangular and crosses the extending portions 45D, 45E of the step portion 45A in a plan view. The hole 155 is formed for removing the residue 51A of the conductive film 51 produced at the extending portions 45D, 45E. The shape of the holes 154, 155 is not necessarily rectangular but may be altered, if necessary.

The resist 153R is formed to cover the section of the display section A1 other than the holes 154, 155. Namely, the resist 153R covers the gate insulation film 45, the source conductive film 46S, the gate conductive film 43G, the drain conductive film 46D, and the semiconductor film 42 and does not cover a section that may cause a short-circuit between the conductive films due to the residue 51A. A part of the residues 51A produced at each of the extending portions 45B, 45D, 45E can be removed by performing the second etching process while using such a resist 153R as a mask. Namely, the residue 51A extending between the conductive films can be cut. The gate insulation film 45 that is covered with the resist 153R is not removed in the second etching process.

Other Embodiments

The present invention is not limited to the embodiments, which have been described using the foregoing descriptions and the drawings. For example, embodiments described below are also included in the technical scope of the present invention.

(1) Each of the above embodiments includes the liquid crystal panel having the rectangular planar shape. However, the present invention can be applied to liquid crystal panels having a planar shape of a square, a circle, or an ellipse.

(2) In each of the above embodiments, the driver is directly mounted on the array board of the liquid crystal panel with a COG technology. The driver may be mounted on the flexible printed circuit board with a Chip on Film (COF) technology.

(3) In each of the above embodiments, the semiconductor film included in the channel section of the TFT is formed of oxide semiconductor material. Other than that, polysilicon (CG silicon (continuous grain silicon) that is a kind of polycrystallized silicon (polycrystalline silicon)) or amorphous silicon may be used as material of the semiconductor film.

(4) Each of the above embodiments includes the liquid crystal panel that includes an FFS mode as an operation mode. However, other liquid crystal panels are also included in the scope of the present invention, for example, a liquid crystal panel that includes an in-plane switching (IPS) mode or a vertical alignment (VA) mode as an operation mode is also included in the scope of the present invention.

(5) In each of the above embodiments, the liquid crystal panel includes the color filters of three colors including red, green, and blue. However, the present invention may be applied to a liquid crystal panel including the color filters of four colors including yellow in addition to red, green, and blue.

(6) Material of the conductive film 51 is not limited to the above described ones but may be altered appropriately. For example, other than aluminum and titanium, a metal film of chromium (Cr), tantalum (Ta), or copper (Cu) may be used as the conductive film 51 and such metal films may be disposed in layers.

(7) In the first embodiment, the resist 53R formed in the second resist forming process is slightly greater than the source conductive film 46S and the drain conductive film 46D in the plan view. However, it is not limited thereto and the resist 53R may have a completely same shape as that of the source conductive film 46S and the drain conductive film 46D in the plan view.

(8) The shape (the forming area) of the gate conductive film 43G, the source conductive film 46S, and the drain conductive film 46D is not limited to that, described in the above embodiments but may be altered, if necessary.

EXPLANATION Of SYMBOLS

30: array board (display panel board), 32: glass substrate (substrate), 35G: gate line, 37G: gate electrode, 38S: source electrode, 39D: drain electrode, 42: semiconductor film, 45: gate insulation film 45A: step portion, 45B: extending portion (extending portion extending from the source conductive film to the drain conductive film), 45D: extending portion (source in-between extending portion extending from one to another of two adjacent source conductive films), 45E: extending portion (opposite-side extending portion extending from the drain conductive film to opposite-side source conductive film), 46D: drain conductive film, 46S: source conductive film, 46S1: source conductive film (opposite-side source conductive film), 51: conductive film (conductive film formed in the conductive film forming process), 53R, 153R: resist (resist covering semiconductor film, source conductive film, and drain conductive film).

The invention claimed is:

1. A method of producing a display panel board comprising:
   a conductive film forming process of forming a conductive film covering a gate insulation film and a semiconductor film, the gate insulation film covering a gate electrode and a gate line formed on a substrate and the semiconductor film formed on the gate insulation film while overlapping the gate electrode;
   a first etching process performed after the conductive film forming process and etching the conductive film and forming a source conductive film and a drain conductive film, the source conductive film including a source electrode connected to the semiconductor film and the drain conductive film including a drain electrode connected to the semiconductor film;
   a resist forming process performed after the first etching process and forming a resist covering the semiconductor film, the source conductive film, and the drain conductive film; and
   a second etching process performed after the resist forming process and performing etching for removing the conductive film while using the resist as a mask.

2. The method of producing a display panel board according to claim 1, wherein in the resist forming process, the resist is formed so as not to be disposed on at least a part of an extending portion of a step portion formed on the gate insulation film, the part of the extending portion extending from the source conductive film to the drain conductive film.

3. The method of producing a display panel board according to claim 1, wherein
   in the first etching process, the source conductive film and the drain conductive film include source conductive films and drain conductive films, and the source conductive films and the drain conductive films are formed and arranged in an extending direction of the gate line, and
   in the resist forming process, the resist is formed so as not to be disposed at least on a part of a source in-between extending portion of a step portion formed on the gate insulation film, the part of the source in-between extending portion extending from one to another of two adjacent source conductive films.

4. The method of producing a display panel board according to claim 1, wherein
in the first etching process, the source conductive film and the drain conductive film include source conductive films and drain conductive films, and the source conductive films and the drain conductive films are formed and arranged in an extending direction of the gate line,
out of two of the source conductive films having the drain conductive film therebetween, one source conductive film disposed on an opposite side from another source conductive film connected to the drain conductive film via the semiconductor film is an opposite-side source conductive film, and
in the resist forming process, the resist is formed so as not to be disposed at least on a part of an opposite-side extending portion of a step portion formed on the gate insulation film, the part of the opposite-side extending portion extending from the drain conductive film to the opposite-side source conductive film.

5. The method of producing a display panel board according to claim 1, wherein
in the resist forming process, the resist is formed in a shape following a shape of the source conductive film and the drain conductive film.

6. The method of producing a display panel board according to claim 1, wherein
in the resist forming process, the resist is formed to cover the gate insulation film.

7. The method of producing a display panel board according to claim 1, wherein the gate electrode and the gate line include aluminum.

* * * * *